(12) United States Patent
Kiran et al.

(10) Patent No.: US 7,646,695 B2
(45) Date of Patent: Jan. 12, 2010

(54) MOLECULAR DATA STORAGE DEVICE AND METHOD THEREOF

(75) Inventors: Kotaru Kiran, Khammam (IN); Vivek Krishnan S, Karnataka (IN)

(73) Assignee: Wipro Limited, Bangalore, Karnataka (IN)

( * ) Notice: Subject to any disclaimer, the term of this patent is extended or adjusted under 35 U.S.C. 154(b) by 487 days.

(21) Appl. No.: 11/553,473

(22) Filed: Oct. 27, 2006

(65) Prior Publication Data

US 2008/0084807 A1    Apr. 10, 2008

(51) Int. Cl.
*G11B 7/00* (2006.01)

(52) U.S. Cl. .................................................... 369/103

(58) Field of Classification Search ................ 369/103, 369/47.1, 112.01, 112.02, 44.23
See application file for complete search history.

(56) References Cited

U.S. PATENT DOCUMENTS

| | | | | |
|---|---|---|---|---|
| 6,256,281 B1 * | 7/2001 | Tanaka et al. | ............... | 369/103 |
| 7,116,626 B1 * | 10/2006 | Woods et al. | ............... | 369/103 |
| 7,200,096 B2 * | 4/2007 | Phua et al. | .................. | 369/103 |

* cited by examiner

*Primary Examiner*—Nabil Z Hindi
(74) *Attorney, Agent, or Firm*—Prakash Nama; Global IP Services, PLLC

(57) ABSTRACT

A molecular data storage device and method thereof are disclosed. In an aspect, the molecular data storage device includes a laser source for providing a photon beam, a beam splitter for splitting the photon beam to provide a first and second coherent beams, a data page modulator for encoding with the first beam to provide a signal beam and a storage material disposed such that the first beam and the second beam enters orthogonal faces thereof.

22 Claims, 3 Drawing Sheets

MOLECULAR DATA STORAGE DEVICE AND METHOD THEREOF

This application claims priority under 35 USC ʔ119 (e) (1) of provisional Application No. IN 1875/CHE/2006, Filed on Oct. 10, 2006

FIELD OF INVENTION

The present invention relates to data storage devices. More specifically, the present invention relates to optical data storage devices based on molecular structures of a material defined by photon beams.

BACKGROUND OF INVENTION

Computer memory devices such as dynamic random access memory (DRAM) and static random access memory (SRAM), electrically erasable programmable read only memory (EEPROM), magnetic hard disk, and the like are widely used in computer systems. These memory devices can store data in increasing capacity as manufacturing technology and science advance. However, even with such advancements and enlarged data storage capacity, these memory devices will not be able to handle the yet higher volume of data needed going forward. Existing memory devices suffer from slow accessing speed as each data bit is stored and retrieved sequentially one bit at a time. Further, computer systems making use of these memory devices are prone to virus attacks.

Therefore, there is a need to provide an alternative memory device, which does not work on current semiconductor material principles, but one that is based on molecular structures of a storage material defined by photon beams for substantially increased storage capacity and accessing speed.

SUMMARY OF INVENTION

A molecular data storage device and method thereof are disclosed. In an aspect, the molecular data storage device includes a laser source for providing a photon beam, a beam splitter for splitting the photon beam to provide a first and second coherent beams, a data page modulator for encoding with the first beam to provide a signal beam and a storage material disposed such that the first beam and the second beam enters orthogonal faces thereof.

In another aspect, the method includes receiving a data for storing at a WRITE port, determining a storing location on a data storage material, the data storage material having at least an iron doped lithium niobate cube and the storing location information is retained in a data allocation table, rendering the data in the form of a data page, encoding a photon beam with the data page to provide a signal beam and illuminating the signal beam and a reference beam at substantially the same time on the data storage material such that the two beams create an interference pattern at the intersection of thereof at the storing location. The signal beam and the reference beam enter orthogonal faces of the iron doped lithium niobate cube.

In yet another aspect, the method further includes receiving a data retrieving instruction and data filename at a READ port, determining the data retrieving location of the data stored on the data storage material, illuminating a read beam (i.e. reference beam) on the data storage material at the data retrieving location, detecting photon beam emanating from the data storage material and decoding the data from the detected photon beam and outputting the same to the READ port.

BRIEF DESCRIPTION OF DRAWINGS

Embodiments of the invention are herein described, purely by way of example, with references made to the accompanying drawings, in which.

DETAILED DESCRIPTION OF INVENTION

A molecular data storage device and method thereof for providing increased storage capacity and increased data storing and retrieving speed are described. Reference will be made to certain embodiments of the invention, examples of which are illustrated in the accompanying drawings.

Figure 1:
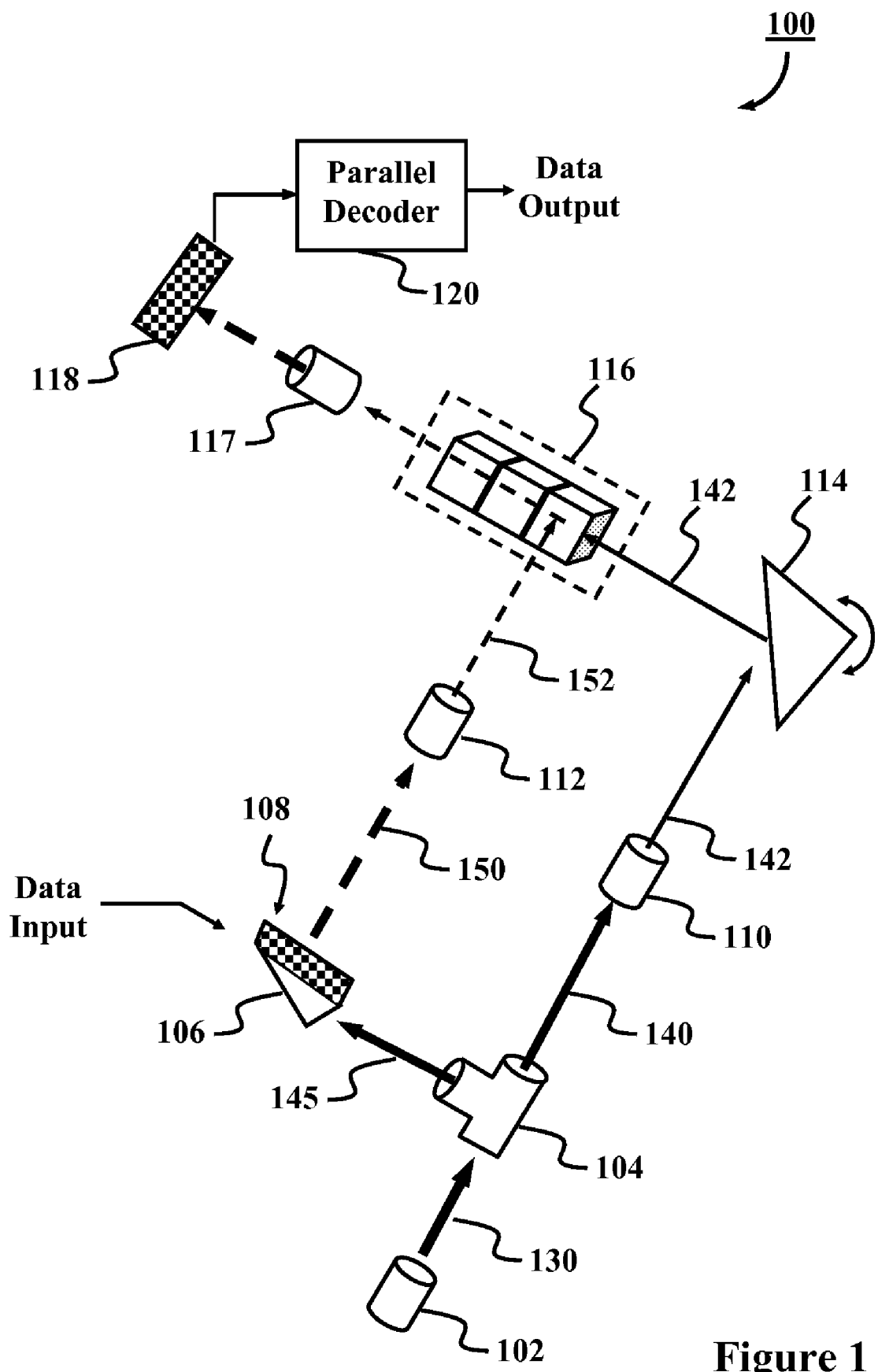
FIG. 1 shows a molecular data storage device according to an embodiment of the present invention.

A molecular data storage device 100 (hereinafter also referred to as "storage device") according to an embodiment is shown in FIG. 1. The storage device 100 stores digital data as encoded in molecular structures of a storage material. The molecular structures of the storage material are changed when a photon beam that is encoded with digital data (a signal or object beam) intersects with another photon beam (a reference beam) having a specific incident angle, amplitude, frequency and phase values. The intersection of the two beams creates an interference pattern in the storage material that represents the digital data. The storage device 100 can be considered a black box and it includes various components sealed inside a container (not shown). The container is an enclosure preventing light from entering and escaping there from. The container, which can be in the shape of a box, includes two communication ports for interfacing the storage device 100 with other computer systems. One of the communication ports is a WRITE port and the other is a READ port. In an embodiment where the storage device 100 is treated as an external storage device, each of the WRITE port and READ port has electrical connections with a respective universal serial bus (USB) port for interfacing with a computer system. Upon connecting the storage device 100 to the computer system, the storage device 100 is recognized by the computer system as detected by a storage device driver that is installed on the computer system. In another embodiment, the WRITE and READ ports of the storage device 100 can be connected to other types of fettered connections, such as a FireWire® connection, and wireless connections, such as Bluetooth®, WiFi, Wireless LAN connections. In yet another embodiment, the WRITE and READ ports can be connected to optic fiber communication links for interfacing with other computer systems.

The various components that make up the storage device 100 include a laser source 102, a beam splitter 104, a modulator 106 having an array of pin diodes 108, lenses 110, 112 and 117, an angular mirror 114, a storage material 116, a demodulator 118, and a parallel decoder 120. According to an embodiment, the laser source 102 is a helium neon (HeNe) laser diode capable of outputting light having colors ranging from infrared to green. The laser source 102 provides a photon beam 130. In an embodiment, the photon beam 130 is an ultraviolet light having a wavelength of approximately 365 nm.

Figure 2:
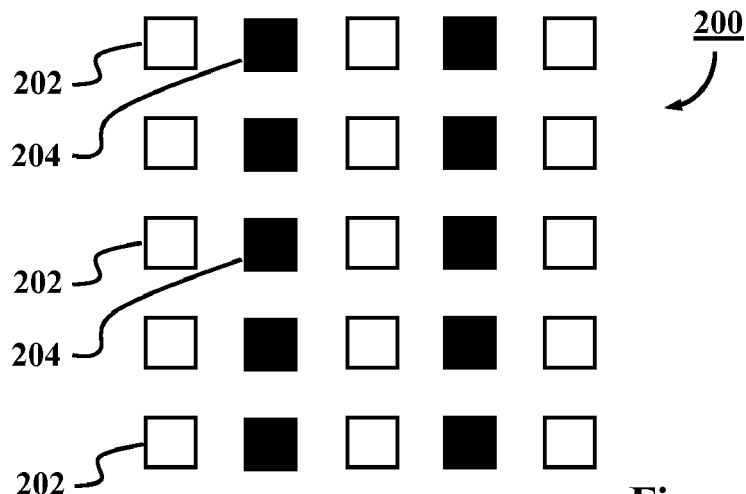
FIG. 2 shows a portion of a modulator having an array of ON and OFF pixels according to an embodiment of the present invention.

The photon beam is subsequently split into two coherent beams by the beam splitter 104. The beam splitter 104 (e.g. 20 mm cube) also acts as a circular polarizer conditioning the beams for writing and reading data. A first beam is used as a reference beam 140 and a second beam 145 that passes through the modulator 106 for encoding with data to form a signal beam 150. The modulator 106 is made of a 2-D array of electrically addressable pin diodes 108, which are responsive to electrical signals representing digital data signals. Typically, digital signals contain 0s and 1s. Each of the bits of the digital signal is mapped to a pin diode of the modulator 106. When the digital signal is a 1, the corresponding pin diode is heated and when the digital signal is a 0, the corresponding pin diode remains in its off start. The purpose of the modulator 106 is to represent serial data in the form of a data page. The size of the data that can be represented by the data page depends on the number of pin diodes 108 or pixels in the array of the modulator 106. For example, the modulator 106 may be made of an array of 10096×10096 pin diodes, whereby each pin diode (pixel) represents a bit of data. Thus, in this example, each data page contains approximately 100 GB of data that can be written/read in one WRITE/READ operation. FIG. 2 shows an example of a portion 200 of the modulator 106 having an array of ON 202 pixels (light) and OFF 204 pixels (dark).

The beam 145 passes through the modulator 106 thereby imprinted with the data page to form the signal beam 150. The signal beam 150 passes through a lens 112 and onto the storage material 116. The purpose of the lens 112 is to demagnify the signal beam 150 so that the demagnified signal beam 152 would incident at an appropriate location of the storage material 116. As such, the position of the lens 112 between the modulator 106 and the storage material 116 is dependent on the required ray size of the signal beam 152. In an embodiment, the lens 112 is maintained at a fixed position so that the signal beam 152 is shone on the storage material 116 from a fixed angle. Accordingly, the storage material 116 is mounted on a movable carrier (not shown) so that the storage material 116 can be traversed along an axis substantially perpendicular to the axis of the incident signal beam 152.

The reference beam 140 passes through a lens 110, which demagnifies the reference beam 140 to provide a demagnified reference beam 142, and onto the storage material 116 via the angular mirror 114. The angular mirror 114 is fitted with an actuator for providing angular movements thereto for directing the incident angle of the reference beam 142 onto the storage material 116. In an embodiment, the angular mirror 114 is made to allow angular movement having an increment of one degree for each different WRITE or READ operations as explained further hereinafter.

The storage material 116 is a photopolymer. According to an embodiment, the storage material 116 is an array of Fe-doped lithium niobate crystal cubes. The lithium niobate ($LiNbO_3$) can be doped with either $Fe^{2+}$ or $Fe^{3+}$ so that when light pattern touches the crystal cube, the molecular structure of the crystal changes as electrons therein absorbed the energy from the light and jump to vacant orbits. The volume of data that can be stored by a centimeter $LiNbO_3$ crystal cube is approximately 1000 GB if the number of different incident angles of the reference beam 142 onto the $LiNbO3$ crystal cube is 10 and each data page contains 100 GB of data. The number of different reference beam 140 angles is dependent on the resolution of the angular mirror 114, which directs the incident angle of the reference beam 142 onto the storage material 116. With 10 different incident angles and a one-degree variation between each of the 10 different incident angles, the angular mirror 114 operates in a 10 degrees freedom of movement aligned in such as way so that the first angle and the tenth angle corresponds to a first edge and a second edge of the crystal cube, respectively. This effectively divides the crystal cube into 10 sections or slices having a thickness defined by the one-degree increment between adjacent sections. The data page is stored in the storage material 116 by the interference of the signal beam 152 with the reference beam 142 which enter orthogonal faces of the $LiNbO3$ crystal cube. The interference of the signal beam 152 and reference beam 142 changes the states of the molecules of the storage material 116 at the point of the interference, whereby molecules in an O state represent binary 0s and those in a Q state represent binary 1s.

The demodulator 118 includes an array of photosensitive diodes. The number of photosensitive diodes and arrangement thereof are the same as the number and arrangement of the pin diodes 108 of the modulator 106. When a reference beam is made to incident the storage material 116 during a READ operation, molecules in the O state, which represent binary 0s, absorbs the reference beam while molecules in the Q state, which represent binary 1s, let the reference beam pass through. This creates a checkboard pattern of light and dark spots that is magnified by the lens 117 and finally detected by the photosensitive diodes on the demodulator 118. The light spots falling on the photosensitive diodes lights up the same representing binary 1s, while dark spots falling on the photosensitive diodes does not light up the same representing binary 0s. In an embodiment, the demodulator 118 is a pixilated photo detector array such as a charge-coupled device (CCD). In another embodiment, the demodulator 118 is a charge-injection device (CID) array, which captures the checkboard pattern as a page of digital information. The array of ON-OFF diodes constitutes a data page (a page of digital information). The data page is subsequently decoded by the parallel decoder 120 and thereafter sent to a data output port, the like of a READ port which is connected to a USB output port for interfacing with other computer systems.

Figure 3:
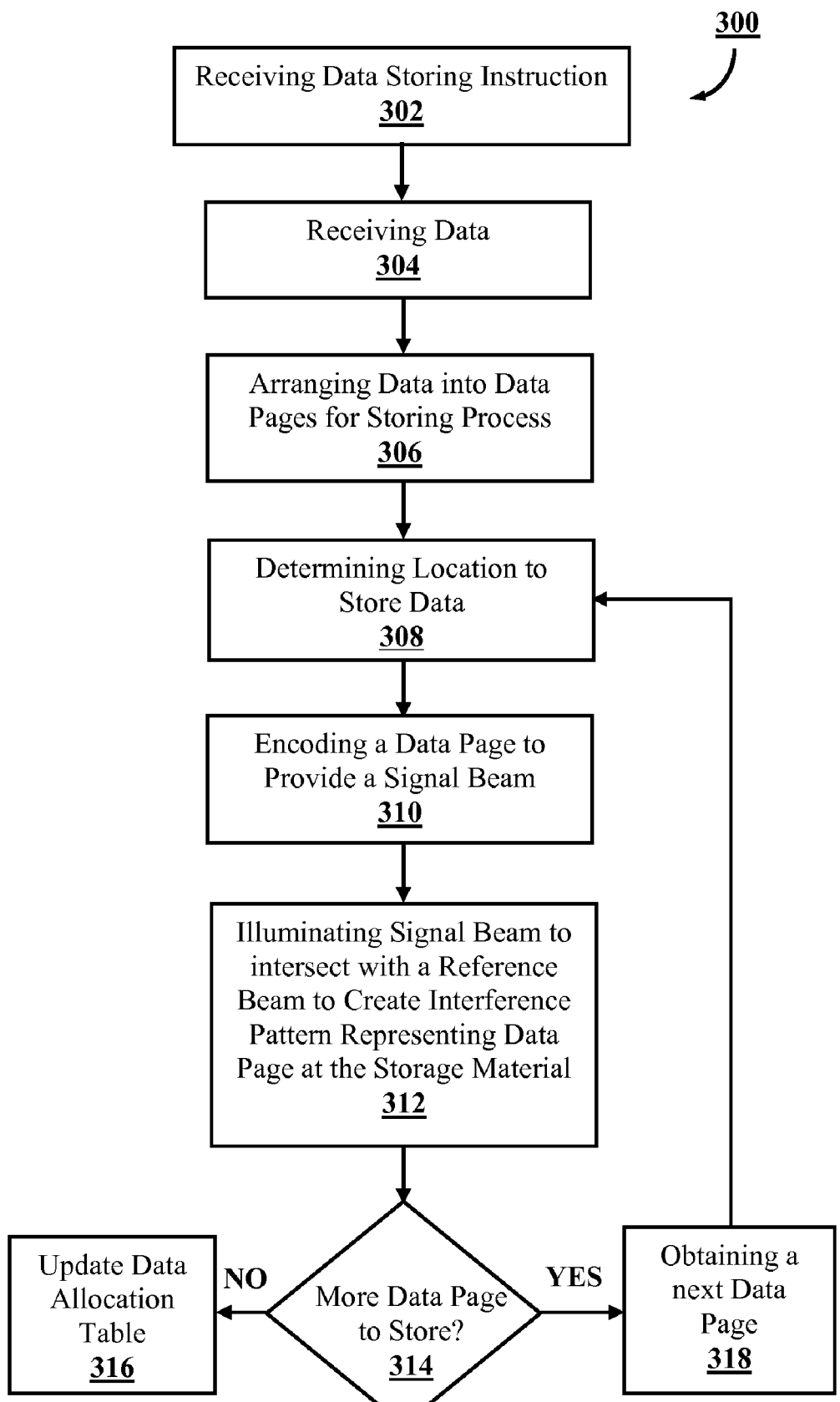
FIG. 3 shows a flowchart detailing steps of a WRITE operation for storing data according to an embodiment of the present invention.

FIG. 3 shows a flowchart 300 detailing steps of a WRITE operation for storing data in the storage material 116. In step 302, the storage device 100 receives a data storing instruction via the WRITE port. Data is received in step 304 from the WRITE port. The data received in step 304 is arranged into data pages in step 306 using the modulator 106. In step 308, the location of the storage material 116 where the incoming data is to be stored is determined. Typically, this location can be determined by looking at a data allocation table, which indicates the next available or empty location in the storage material 116. The next available location is identified by which of one-centimeter crystal cubes of the storage material 116 is to be positioned so that the signal beam would incident on and the incident angle of the reference beam 142. Once the location is determined, the angular mirror 114 is rotated to direct the reference beam to incident on the crystal cube at the identified incident angle and the carrier on which the storage material 116 is fixed is moved such that the signal beam 152 would incident the correct crystal cube.

In step 310, a signal beam is created. This is achieved by passing a photon beam through a data page that is pixelated on the modulator 106. The signal beam is made to fall on the storage material 116 at the same time as the reference beam in step 312. The WRITE operation is initiated by firing a beam 130, which is subsequently split into two coherent beams 145 and 140 by the beam splitter 104. Beam 145 passes through the modulator 106 thereby encoded with the data page to form the signal beam 150. The signal beam 150 passes through a lens 112 and incident the storage material at the determined location. At the same time, beam 140, which is a reference beam, passes through the lens 110 and reflected off the angular mirror 114 to incident the storage material at an angle such that it intersects with the signal beam 152 to create an interference pattern at the determined location of the storage material 116. The interference pattern is representative of the data page with the molecules at the points of interference being at a Q state, encoding a binary 1 or an O state, encoding a binary 0. In step 314, a check is made to determine if there is more data to be stored. If there is none, the storing process ends in step 316 where the data allocation table is updated so that the data can be retrieved with a READ operation. However, if there is data remained, the storing process repeats from step 308.

Figure 4:
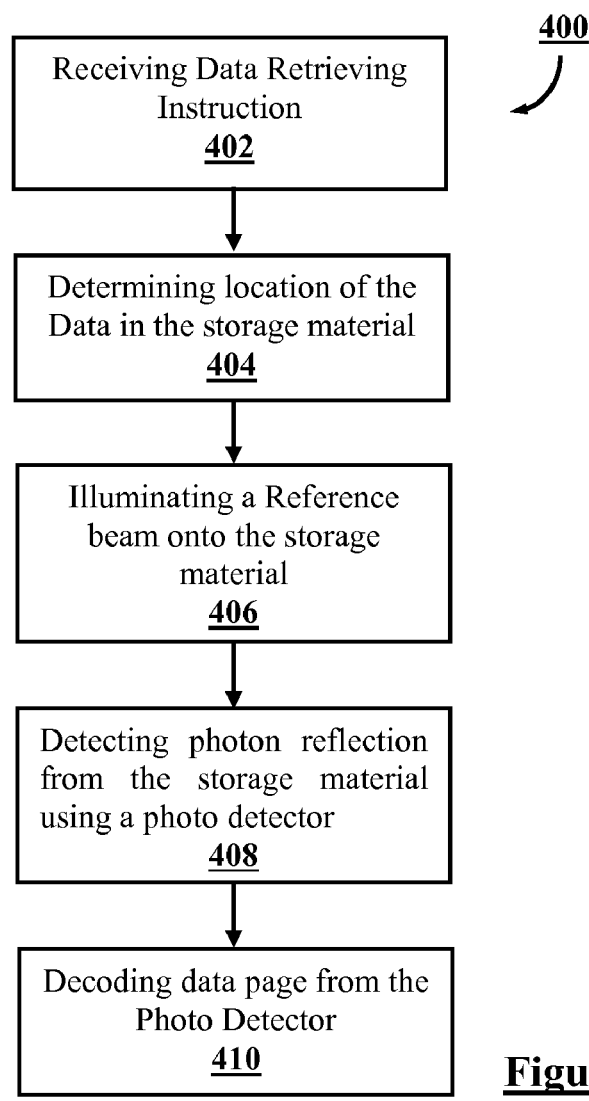
FIG. 4 shows a flowchart detailing steps a READ operation for retrieving data according to an embodiment of the present invention.

FIG. 4 shows a flowchart 400 detailing steps of a READ operation for retrieving data from the storage material 116. In step 402, the storage device 100 receives a data retrieving instruction from the READ port. A file name of the data is received in step 404 and the location of the data stored in the storage material 116 is determined from the data allocation table. In step 406 a reading beam (i.e. reference beam) is fired at the storage material 116 at an incident angle that was used to store the data in the determined location in the storage material 116. In this step 406, the beam 145 is blocked by a shutter (not shown). Molecules in the O state, which represents binary 0s, absorbs the reading beam while molecules in the Q state, which represents binary 1s, allow the reading beam passes through. This creates a checkboard pattern of light and dark spots photon beam emanating from the storage material 116 and falls onto the demodulator 118. The checkboard pattern photon beam is detected by the photosensitive diodes of the demodulator 118 resulting in a data page in step 408. The parallel decoder 120 decodes the data page and outputs the decoded data to the requesting source via the READ port in step 410.

While the present invention is described in conjunction with the above embodiments, it will be understood that it is not intended to limit the invention to these particular embodiments alone. On the contrary, the invention is intended to cover alternatives, modifications and equivalents that are within the spirit and scope of the invention as defined by the appended claims.

The invention claimed is:

1. A data storage device comprising:
a laser source for providing a photon beam;
a beam splitter for splitting the photon beam to provide a first and second coherent beams;
a data page modulator for encoding with the first beam to provide a signal beam, wherein the data page modulator comprises an array of electrically addressable pin diodes, and wherein the pin diodes lights up in response to a binary 1 and remains in an off state in response to a binary 0 in encoding the first beam; and
a storage material, wherein the storage material comprises a photo polymer, and wherein the photo polymer is disposed such that the signal beam and the second beam enters orthogonal faces thereof.

2. The data storage device of claim 1, wherein the laser source is a helium neon laser.

3. The data storage device of claim 1, wherein the photopolymer comprises at least one iron (Fe) doped lithium niobate (LiNbO3) cube.

4. The data storage device of claim 3, wherein the lithium niobate cube being doped with $Fe^{2+}$.

5. The data storage device of claim 3, wherein the lithium niobate cube being doped with $Fe^{3+}$.

6. The data storage device of claim 3, wherein the lithium niobate cube has sides substantially one centimeter wide.

7. The data storage device of claim 1 further comprising an angular mirror for routing the second beam to incident a face of the photopolymer crystal cube at an angle.

8. The data storage device of claim 1 further comprising a shutter for blocking the first beam, the shutter being disposed between the splitter beam and the data page modulator.

9. The data storage device of claim 1 further comprising a movable carrier for disposing the photopolymer thereon and moving the same along an axis substantially perpendicular to the incident angle of the signal beam.

10. The data storage device of claim 1 further comprising a WRITE port for receiving data storing instruction, data and forwarding the same to the data page modulator.

11. The data storage device of claim 1 further comprising a demodulator disposed such that the second beam entering the photopolymer crystal cube causing a third beam to emanate therefrom to fall on the demodulator.

12. The data storage device of claim 11, wherein the demodulator comprises an array of photosensitive diodes.

13. The data storage device of claim 11, wherein the demodulator comprises an array of charge-coupled devices.

14. The data storage device of claim 11, wherein the demodulator comprises an array of charge-injection devices.

15. The data storage device of claim 11 further comprising a READ port for receiving data retrieving instruction and outputting the requested data received from the demodulator.

16. A method comprising:
receiving a data for storing at a WRITE port;
determining a storing location on a data storage material, the data storage material comprising at least an iron doped lithium niobate cube, the storing location information being retained in a data allocation table;
rendering the data in the form of a data page, wherein rendering the data in the form of the data page comprises streaming data to a 2-D array of electrically addressable pin diodes, the pin diodes lights up in response to a binary 1 data and remains in an off state in response to a binary 0;
encoding a photon beam with the data page to provide a signal beam; and
illuminating the signal beam and a reference beam at substantially the same time on the data storage material such that the two beams create an interference pattern at the intersection of thereof at the storing location, the signal beam and the reference beam enter orthogonal faces of the iron doped lithium niobate cube.

17. The method of claim 16, wherein encoding the photon beam with the data page comprising passing the photon beam through the 2-D array of pin diodes.

18. The method of claim 16, wherein illuminating the signal and reference beams comprises passing the signal and reference beams through respective lenses, wherein the lenses demagnify the respective beams prior the same reaching the storage material.

19. The method of claim 16 further comprising: receiving a data retrieving instruction and data filename at a READ port; determining the data retrieving location of the data stored on the data storage material; illuminating a reading beam on the data storage material at the data retrieving location; detecting photon beam emanating from the data storage material; and
decoding the data from the detected photon beam and outputting the same to the READ port.

20. The method of claim 19, wherein determining the data retrieving location comprises searching the data allocation table for the data filename and extracting the retrieving location information of the data filename for directing the reading beam to enter the storage material at the appropriate location.

21. The method of claim 19, wherein detecting the photon beam comprises using a plurality of photosensitive diodes to detect the photon beam, the plurality of photosensitive diodes being arranged in a 2-D electrically addressable array.

22. A computer readable storage medium having instructions thereon which when executed by a computer system, cause the computer system to perform a method comprising the steps of:

receiving a data for storing at a WRITE port;

determining a storing location on a data storage material, the data storage material comprising at least an iron doped lithium niobate cube, the storing location information being retained in a data allocation table;

rendering the data in the form of a data page, wherein rendering the data in the form of the data page comprises streaming data to a 2-D array of electrically addressable pin diodes, the pin diodes lights up in response to a binary 1 data and remains in an off state in response to a binary 0;

encoding a photon beam with the data page to provide a signal beam; and illuminating the signal beam and a reference beam at substantially the same time on the data storage material such that the two beams create an interference pattern at the intersection of thereof at the storing location, the signal beam and the reference beam enter orthogonal faces of the iron doped lithium niobate cube.

* * * * *

UNITED STATES PATENT AND TRADEMARK OFFICE
CERTIFICATE OF CORRECTION

| | |
|---|---|
| PATENT NO. | : 7,646,695 B2 |
| APPLICATION NO. | : 11/553473 |
| DATED | : January 12, 2010 |
| INVENTOR(S) | : Kotaru Kiran et al. |

It is certified that error appears in the above-identified patent and that said Letters Patent is hereby corrected as shown below:

On the title page item (73), the Assignee name should read as:

"Wipro Limited, Bangalore, Karnataka (IN)"

Signed and Sealed this

Sixth Day of April, 2010

David J. Kappos
*Director of the United States Patent and Trademark Office*